United States Patent [19]
Holstein et al.

[11] Patent Number: 4,829,239
[45] Date of Patent: May 9, 1989

[54] MULTIMETER

[75] Inventors: Jörg Holstein, Nuremberg; Lothar Rapp, Fuerth, both of Fed. Rep. of Germany

[73] Assignee: Muller & Weigert, GmbH, Nuremberg, Fed. Rep. of Germany

[21] Appl. No.: 137,535
[22] PCT Filed: Apr. 8, 1987
[86] PCT No.: PCT/EP87/00191
 § 371 Date: Dec. 1, 1987
 § 102(e) Date: Dec. 1, 1987
[87] PCT Pub. No.: WO87/06352
 PCT Pub. Date: Oct. 22, 1987

[30] Foreign Application Priority Data
 Apr. 9, 1986 [DE] Fed. Rep. of Germany ....... 3611855

[51] Int. Cl.$^4$ ............................................. G01R 33/00
[52] U.S. Cl. ................................ 324/117 H; 324/111; 324/116
[58] Field of Search ................... 324/103 R, 142, 130, 324/117 H, 111, 116, 117 R; 379/6, 30

[56] References Cited
U.S. PATENT DOCUMENTS

| | | | |
|---|---|---|---|
| 2,886,779 | 5/1959 | Kuhrt et al. | 324/127 |
| 4,514,685 | 4/1985 | Gilker | 324/142 |
| 4,516,070 | 5/1985 | Brown et al. | 379/6 |
| 4,517,513 | 5/1985 | Brown | 379/6 |
| 4,536,706 | 8/1985 | Kemper | 379/30 |

FOREIGN PATENT DOCUMENTS

| | | |
|---|---|---|
| 0067527 | 12/1982 | European Pat. Off. |
| 2409247 | 9/1975 | Fed. Rep. of Germany. |
| 3323961 | 1/1985 | Fed. Rep. of Germany. |
| 2381317 | 9/1978 | France. |

OTHER PUBLICATIONS

*Elektronik*, Band 25, 16, Dec., 1983, Franzis-Verlag GmbH (Munich), "Stromzange Misst Lageunabhangig", p. 104.
DE, A 3323961 (P. S. Baier et al.), Jan. 10, 1985, siehe Seite 11, Zeile 13–Seite 12, Zeile 6, Seite 12, Zeile 17–Seite 13, Zeile 14.
JEE, *Journal of Electronic Engineering*, No. 129, Sep. 1977, Dempa Publications Incs. (Tokyo), "Clamp-on-Maters—Ideal Measuring Instruments for Electrical Systems":, pp. 26–27.

*Primary Examiner*—Michael J. Tokar
*Attorney, Agent, or Firm*—Thomas L. Peterson

[57] ABSTRACT

A multimeter comprising a clip-on device (12) and a Hall-effect measuring circuit (5) for measuring either a direct or an alternating current I. Moreover, the multimeter comprises a voltage-measuring circuit (2) for measuring either a d.c. or an a.c. voltage U as applied to two input/output combination sockets (3, 4). By means of a function transformer (30), a digitizing unit (19), a digital unit (25) and further circuit components which also include a battery-operated power-supply unit (1), the measured current and/or voltage values, by taking into due consideration any stored correcting values as well as such correcting values which result from adjusting measurements, and any circuit-specific constants as already previously stored by the manufacturer, are processed in accordance with predetermined rules for proportioning into display signal-waveform-independent values relating to the current I, the voltage U, the apparent power Ps, the real power Pw, the power factor, the frequency f, and further values.

26 Claims, 1 Drawing Sheet

MULTIMETER

FIELD OF THE INVENTION

The present invention relates to a portable multimeter for measuring electrical quantities from the fields of electrical installation engineering. As the essential instrument transducer there is used a clip provided with Hall sensors which, for d.c. or a.c. measurements, embraces the respective current conductor to be measured. Relative thereto, the overall measuring range is divided into at least two switchable measuring ranges.

BACKGROUND

A multimeter of this type has been described on page 104 of the German technical journal "Elektronik", No. 25 of Dec. 16, 1983. In this multimeter the clip is a separate instrument transducer which is connected by cable to the display unit. Moreover, in EP-A No. 67 527, there is described a clip-on measuring device provided with two Hall sensors, which is designed as a one-piece measuring device with a digital measured value display and which, owing to a special opening mechanism of the clips, is particularly suitable for measuring direct currents.

Such clip-on measuring devices have found wide acceptance in the fields of electrical installation measuring engineering because they, as is well known, permit current measurements to be carried out without any opening or stripping of the conductor, hence during normal operation.

It has been noticed as a disadvantage of such clip-on measuring devices that their measuring accuracy still leaves a lot to be desired. Also, different types of clip-on measuring devices are required for d.c. and a.c. measurements, while those which are provided with Hall sensors, as shown above, can be made suitable for both d.c. and a.c. measurements. There are also known clip-on power meters to which, for power measurement, there is additionally applied the voltage which is taken off by the user.

Mostly, the accuracy of the measurement also suffers from the fact that the measured value as displayed depends on the shape of curve, and hence does not correspond to a genuine root-mean-square-value measurement.

It is the object of the invention as characterized in the claims, therefore, to further embody the previously described multimeter in such a way that it, with improved accuracy, permits the measurement of displayed current, voltage, power and frequency values which are all independent of signal shapes, with the possibilities of practical use of the multimeter still not yet being fully exhausted.

SUMMARY OF THE INVENTION

Briefly, and in general terms, the present invention is directed to a multimeter of the type having a clip including at least one Hall sensor; a Hall-effect measuring circuit for measuring a current I flowing in a conductor embraced by said clip; and a display unit for displaying the value of the current I as measured by the measuring circuit. The multimeter has at least two switchable measuring ranges. A voltage-measuring circuit is provided for measuring a voltage U which, as a DC or AC quantity, is supplied to an input means. A microprocessor and storage means for storing data are also provided. The measured current I and voltage U values, together with stored correcting values resulting from an adjusting measurement preceding the actual measurement in terms of time, and with circuit-specific constants as stored by the manufacturer, are stored as data and are selectively processed by means of the microprocessor into values of direct or of alternating current I, of DC or AC voltage U, of apparent power Ps, of real power Pw, of power factor cos (phi), or of the frequency f, with the microprocessor controlling the display unit to display the aforesaid values, by forming the root-mean-square value, being independent of the waveform of the current I to be measured and/or of the voltage U to be measured. Range switching is effected by the microprocessor as soon as it is detected by the latter that a range has been exceeded in the course of a measuring process.

In another aspect, the invention provides a method for measuring electrical signals by means of an electrically operated measuring device, comprising an analog circuit module, a digital circuit module including a digital processor, and a digital memory, the method comprising the steps of: generating offset signals when the measuring device is switched on, said offset signals being generated within the measuring device within said analog circuit module; storing the offset signals in digital form in said memory; converting the digital offset signals stored in said memory into analog offset electrical signals during a subsequent measurement of said electrical signal by the measuring device; and subtracting said offset electrical signals from said electrical signals to be measured under control of a digital processor, so that said measured electrical signals subject to offset subtraction are valid measurements of the electrical signal sought to be measured.

The present invention also provides a circuit for measuring electrical signals comprising, inter alia, a digital processor with a memory; a root mean square circuit for generating the root mean square of a signal input to it; an adjustable current source for supplying a Hall current of selective amplitude, said adjustable current source having two inputs; a plurality of Hall sensors having Hall current terminals coupled to said adjustable current source and supplied with said Hall current thereby, and having Hall voltage terminals; and a summing circuit coupled to said Hall voltage terminals of said plurality of Hall sensors, said summing circuit for summing all voltages generated by said Hall sensors. A variable gain amplifier has its input coupled to the output of said summing circuit; and an electronically controlled first and second changeover switch, each said changeover switch having two changeover contacts and a switching contact which is selectively coupled to one of said changeover contacts. The first and second changeover switches are coupled to and controlled by said digital processor, a first changeover contact of said first changeover switch being coupled to the output of said variable gain amplifier, a second changeover contact of said first changeover switch being coupled to the output of said variable gain amplifier, a second changeover contact of said first changeover switch being coupled to a preselected voltage, said switching contact of said first changeover switch being coupled to said root mean square value circuit, said root mean square circuit generating a DC voltage corresponding to the root mean square value of the output of said variable gain amplifier, said second changeover contact of said first changeover switch also being coupled to a first changeover contact of said second changeover switch, said second changeover switch having its switching contact connected to the first one of the inputs of said adjustable current source, a second changeover contact of said second changeover switch being connected to the Hall current terminqals of said Hall sensors, said Hall current terminals being coupled to said output of said adjustable current source and a second input of said adjustable current source. An analog-to-digital converter has its input coupled to said DC voltage of said root mean square value circuit and its output coupled to said memory input of said digital processor.

The present invention also is directed to a multimeter circuit for measuring a plurality of electrical parameters of a signal in a wire with automatic offset error adjustment, automatic zeroing adjustment and automatic range selection. The circuit includes a digital processor; a magnetic circuit loop with two gaps through which loop said wire is disposed; two Hall effect sensors, one sensor disposed in each one of said gaps in said magnetic circuit loop; and a summing circuit coupled to said Hall effect sensors for summing the output Hall voltages from said sensors. A controlled voltage source is coupled to said digital processor, said controlled voltage source generating a zeroing voltage in response to command signals from said digital processor. A variable amplifier is coupled to the output of said summing circuit to selectively generate an amplified measured analog signal corresponding to said electrical parameter to be measured or an intermediate function from which said electrical parameter to be measured is later computed, said variable amplifier being coupled to and responsive to said controlled voltage source to generate a zero output before measurement of said parameters in said wire is performed, said zeroing voltage being applied to said variable amplifier to selectively cause said variable amplifier to generate said zero output. A plurality of analog circuits selectively generate a plurality of analog functions of signals input to said analog circuits, said analog functions including root mean squares and selected time integrals. An analog-to-digital convertor with an input selectively coupled to said plurality of analog circutis, the analog-to-digital convertor generating a digital signal corresponding to selected ones of said plurality of analog circuits, said analog-to-digital convertor having its output coupled to said digital processor. A variable current source has its output coupled to said Hall sensors and controlled by said digital processor for selectively generating offset currents to cancel offset errors in said Hall sensors and for generating selected magnitudes of Hall currents dependent on the amplitude ranges of said electrical parameters to be measured, whereby said multimeter circuit measures current in said wire with automatic range switching, measures peak value currents in said wire with automatic range switching, measures voltage in said wire with automatic range switching, measures real power in said wire with automatic range switching, measures apparent power in said wire with automatic range switching, measures frequency of said signal in said wire with automatic range switching, and measures a function of phase of said signal in said wire.

DETAILED DESCRIPTION

Figure 1:
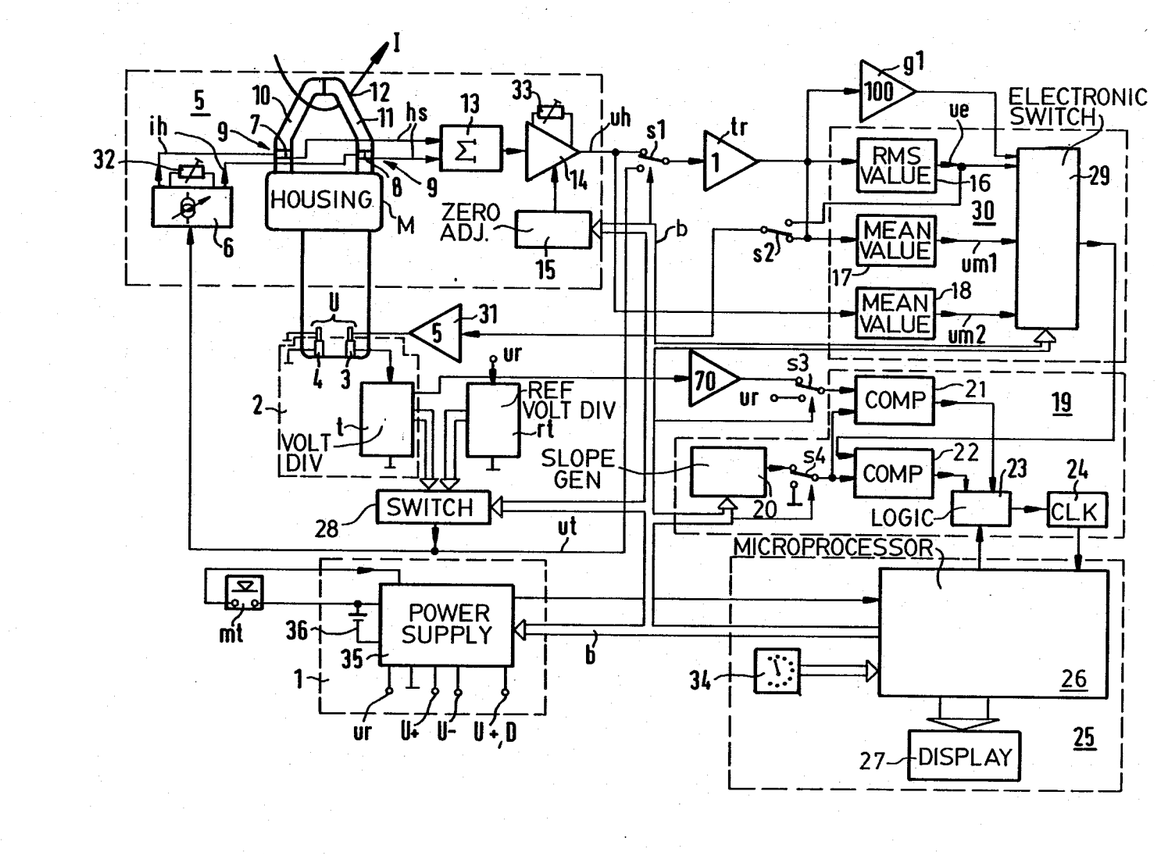
The drawing is a block diagram of a multimeter according to the present invention.

The invention will now be explained in greater detail with reference to the accompanying drawing which, schematically in the form of a block diagram, shows an exemplified embodiment of the overall circuit of the multimeter.

In the block diagram according to the accompanying drawing there is shown the housing M of the multimeter with the two legs 10, 11 of the clip 12. The latter is shown to embrace a current conductor conducting the current I. The further circuit components as shown in the drawing are accommodated on individual circuit boards as mounted inside the housing M. Let into this housing M and accessible from the outside are the liquid-crystal display 27, the measuring key mt, the selector switch 34, the switching lever as accessible from the outside, of the second changeover switch s2, and the input/output combination sockets 3,4 which, on the one hand, serve to supply the voltage U to be measured, but, on the other hand, via a special connector, also permits an internal measuring voltage to become accessible from the outside for registration purposes, such as for the registration of the current I.

In a gap 9 of each of the two legs 10, 11 of the clip 12 there is fitted a Hall sensor 7, 8 which is diagrammatically depicted in the figure. Those skilled in the art will appreciate that each Hall sensors 7, 8 have separate connections for (1) a current loop in which flows Hall current ih, generated by means of the constant current source 6 and (2) an output voltage hs. For ease of representation, the ground returns are not shown in the Figure. Both the amount and direction of the two Hall currents ih are determined by a control voltage applied to the constant current source 6. The ratio of the Hall currents flowing through the two Hall sensors 7, 8 is variable by the first adjusting device 32. This permits the manufacturer to compensate for any inequalities of the two Hall sensors 7,8 and for any inequalities of the two legs 10,11. The output voltages of the two Hall sensors 7,8, i.e. the two Hall-sensor voltages hs, are added by the summer 13. The output signal thereof is amplified by the variable-gain amplifier 14 whose output signal is also the output signal of the Hall-effect measuring circuit 5, namely the Hall voltage uh. The Hall-effect measuring circuit 5 includes the just described circuit components.

By means of the second adjusting device 33 the variable-gain amplifier 14 becomes variable in its gain. With it and with a suitable standardizing current the current measuring value is calibrated to the display at the manufacturer's plant.

The voltage-measuring circuit 2 represents a further measuring circuit which essentially consists of the input-voltage divider t which, with its one end, is connected to the input/output combination socket 3 and, with its other end, to ground. The different voltage taps of this input-voltage divider are led out of the voltage-measuring circuit 2.

A further block of associated circuit components forms the function transformer 30. It includes the root-mean-square-value model 16, the first and the second mean-value formers 17,18, and the first electronic changeover switch 29. Within the function transformer 30, the output of the root-mean-square-value module 16 as well as that of the first and the second mean-value formers 17,18, are respectively connected to one input of the first electronic changeover switch 29 whose output, in turn, is connected to one input of the digitizing unit (A/D converter) 19.

The input signals of the function transformer 30 are the input signal of the root-mean-square-value module 16 as well as that of the first and the second mean-value formers 17,18. The input of the root-mean-square-value module 16 and that of the first mean-value former 17 are connected to one another, and are moreover connected to the input of the first amplifier g1 whose output signal is fed to a further input of the first electronic changeover switch 29, with the gain factor preferably equalling 100.

The electrical connection between the Hall-effect measuring circuit 5 and the function transformer 30 is established firstly by a direct connection between the output of the Hall-effect measuring circuit 5 and the input of the second mean-value former 18 and, secondly, by a connection via the first switching contact of the first changeover switch s1, to the input of the impedance transformer tr, and from the output thereof to the interconnected inputs of the first amplifier g1, of the root-mean-square-value module 16 and of the first mean-value former 17.

The voltage taps of the input voltage divider t are each connected to one input of the second electronic multiple switch 28. The reference-voltage divider rt which is supplied with an output voltage of the power supply unit 1, namely the reference voltage ur, and whose other side is connected to ground, is connected with its voltage taps likewise to respectively one free input of the second electronic multiple switch 28. Quite depending on the respective switch position of the latter there is now provided either a differently high U-dependent voltage signal or a differently high fixed voltage signal at the output of the second electronic multiple switch 28 which is connected to the control input of the constant current source 6 and to the second input of the first changeover switch s1. In that way the Hall current ih becomes a previously selectable constant value for the various current-measuring ranges.

For the real-power measurement Pw, however, the Hall current ih is directly proportional to the instantaneous value of the supplied voltage U, no matter whether there is concerned a d.c., a.c. or distorted voltage. The different taps of the input voltage divider t also permit a range switching in the case of real-power measurements.

As is well known, the measurement of the supplied d.c. or a.c. current I is based on the physical property of the Hall sensors, according to which their transmitted Hall-sensor voltage hs is proportional to the instantaneous value of the Hall current ih and to the instantaneous value of the magnetic flux which, in turn, is proportional to the instantaneous current I as embraced by the clip-on device 12. If, on accout of suitable measures, for example, by means of the input voltage divider t, the Hall current ih is proportional to the voltage as measured by the user, viz. is made proportional to the measured voltage U, then the transmitted Hall-sensor voltage hs is proportional to the real power Pw as instantaneously measured by the user of the device. Accordingly, this real power Pw is available as an instantaneous-value quantity in the form of the Hall-sensor voltage hs for the further signal processing.

The conversion of the instantaneous value as available during the current and voltage measurement is carried out in the root-mean-square-value module 16 to which, as the input signal, as already described, there is fed either the Hall voltage uh or the output voltage of the second electronic multiple switch 28, namely a divided voltage ut. Moreover, during the current measurement, the output signal of the root-mean-square-value module 16 can be supplied to input/output combination socket 3 via the externally adjustable second changeover switch s2 and a buffer amplifier 31 whose gain amounts to e.g. 5. In the other position of the second changeover switch s2, the input instead of being the output of the root-mean-square-value module 16 is connected, so that the measuring signal as taken off at the input/output combination socket 3 is proportional to the instantaneous value of the applied current I.

The output signals of the first electronic multiple switch 29 are digitized in the digitizing unit 19 which includes a single-slope generator 20, the first and a second comparator 21,22, a logic circuit 23, a clock generator 24, as well as a third and a fourth changeover switch s3, s4. Apart from the A/D conversion, the digitizing unit 19 serves to determine time differences which occur when the frequency f and the power factor cos (phi) are measured. Analog values are essentially digitized in that the single-slope generator 20, via the fourth changeover switch s4 or the output signal of the first electronic multiple switch 29, is respectively switched to a reference or to a measuring input of the second comparator 22 whose output is connected to one input of the logic circuit 23. The reference or measuring input of the first comparator 21 is switched via the fourth changeover switch s4, to the output of the single-slope generator 20, or via the third changeover switch s3, to the reference voltage ur respectively, with the output being connected to the other input of the logical circuit 23. The starting voltage of the single-slope generator 20 is higher than the reference voltage ur, and upon reaching of the latter there is caused a relaxation of the output signal of the first comparator 21 which, at the output of the logic circuit 23, produces a gating pulse which is passed to the clock generator 24. As soon as the single-slope generator output voltage, which decreases linearly with time, reaches a level which is equal to that of the output signal of the first electronic multiple switch 29, the second comparator 22 assumes its respective other state and, via the logical circuit 23, terminates the gating pulse. For the time duration of the gating pulse the clock generator 24 passes counting signals to the counting input of the microprocessor 26; the frequency amounts to e.g. 300 kHz.

The frequency measurement is carried out via the measurement of the period T, and the latter is determined in the digitizing unit 19 from the time interval between two unidirectional zero crossings of a measuring signal which is proportional either to the alternating current I or to the a.c. voltage U. In the accompanying drawing this is indicated, for example, by the switch position of the third changeover switch s3, with respect to the applied voltage U. In order to reliably detect the zero crossings of the divided voltage ut, the latter is taken off a relatively high tapping point of the input voltage divider t and is additionally further amplified by means of the second amplifier g2 whose gain factor amounts, for example, to 70. In this way, the divided voltage ut has almost become a square-wave signal with steep edges which, via the one input of the third changeover switch s3, is passed to the measuring input of the first comparator 21. In the respective other position of the third changeover switch s3 the reference voltage ur is connected to the measuring input. In this case the reference input is connected to ground via the fourth changeover switch s4; in the respective other switch position thereof, the single-slope generator 20 is connected, as already described hereinbefore, to the input of the second comparator 22. The output signal of the first comparator 21, in cooperation with logic circuit 23 which, in this particular case may be e.g. a binary divider, produces a gating signal having the cycle duration T of the input a.c. voltage period and which, for the duration thereof, passes counting pulses of the clock generator 24 to the counting input of the microprocessor 26.

For measuring the power factor cos (phi) it is necessary, apart from measuring the period T, to measure the time interval dt between the unidirectional zero crossing of the alternating current I and the zero crossing of the a.c. voltage U which is unidirectional in relation thereto. For this purpose, the Hall voltage uh is converted with the aid of the first amplifier g1 into a steep-edge square-wave signal which, as the output signal of the first electronic changeover switch 29, is passed to the measuring input of the second comparator 22.

As already described hereinbefore in connection with the frequency measurement, the output signal of the second amplifier g2 which is proportional to the a.c. voltage U, is applied to the measuring input of the first comparator 21. The reference input of the first and of the second comparator 21, 22 is connected to ground via the fourth changeover switch s4. Here, the logical circuit 23 now produces a gating pulse whose width is proportional to the time interval dt, and thus determines the number of counting pulses applied to the microprocessor 26.

The different behaviour of the logic circuit 23 in determining the time interval dt and the period T is controlled by a control signal of the microprocessor 26 which, moreover, via the control bus b, controls the respective switch position of either the first or the second electronic changeover switch 28 or 29, and also puts into operation the single-slope generator 20 and the multiple voltage generator 35 in the power supply unit 1. Moreover, the first, the third and the fourth changeover switches are likewise controlled by the microprocessor 26. The digital unit 25 as shown in the accompanying drawing includes the microprocessor 26, the liquid-crystal display 27 as directly controlled by the latter, and the selector switch 34 whose outputs are each connected to one input terminal of the microprocessor 26.

In the power supply unit 1 the battery 36 supplies the multiple voltage generator 35 which provides the reference voltage ur, the negative and the positive supply voltages U− and U+, as well as the ground potential and, for the liquid-crystal display, the further positive supply voltage U+,D. The one pole of the battery 36 is connected via the measuring key mt to the multiple voltage generator 35 in order to let the latter start in response to a key actuation. Furthermore, a signal line is connected from the measuring key mt, via the multiple voltage generator 35, to one input terminal of the microprocessor 26, which provides the latter with a voltage of e.g. 5 V as long as the measuring key mt is depressed.

Via the control bus b, the microprocessor 26 completely disconnects the power supply unit 1 from the battery 36 after the lapse of a predetermined period of time during which the measuring key mt is not actuated. In addition, and in order to save power, the power supply for the measuring and the signal-processing unit is disconnected immediately after completion of the actual measuring process, while maintaining with the aid of the positive supply voltage U+,D, merely a "display hold" mode at a low current-consumption level.

The initial depression of the measuring key mt triggers a "power-on" reset which puts into operation an adjusting routine which is controlled by the microprocessor 26. Here, there is determined the first offset voltage u1 of the Hall-effect measuring circuit in that, without the current I to be measured, the Hall current ih is adjusted to zero, with the Hall voltage uh being measured thereafter. This is the first correcting value to be determined by way of adjustment, which is taken over or read into the memory section of the microprocessor 26. In the accompanying drawing the Hall-effect measuring circuit 5 is shown to include the zero-adjustment circuit 15 which is controlled by the microprocessor 26, with the output thereof, for effecting the zero adjustment, being connected to the variable-gain amplifier 14. Accordingly, via both the microprocessor 26 and the zero-adjustment circuit 15 there is thus established a regulating circuit by which the first offset voltate u1 is regulated to zero. The aforementioned zero-adjustment circuit 15 may, for example, be a digital-to-analog (D/A) converter whose output voltage is connected to the input voltage of the variable-gain amplifier 14 across a resistor.

A second correcting value to be determined by way of adjustment, namely the proportional control factor p, results from the fact that even in the case of an adjusted first offset voltage u1, the Hall voltage uh will not remain to be adjusted when the Hall current ih is turned on as well; in fact, the resulting zero division of the Hall voltage uh is proportional to the respective set Hall current ih, in the course of which, however, there may not flow a current I to be measured. Accordingly, the proportional control factor p is determined from the zero deviation (variation) of the Hall voltage uh in the case of two different Hall currents ih1, ih2, as the second correcting value to be stored.

A third correcting value to be determined by way of adjustment, and which is likewise stored, is the second offset voltage u2 of the root-means-square-value module 16. For the purpose of measuring this voltage, via the second electronic changeover switch 28, or else via a further changeover switch not shown in the drawing, the input of the root-mean-square-value module 16 is grounded, and the associated root-mean-square-value voltage ue is measured at the output.

The fourth or fifth correcting value to be determined by way of adjustment is the third or fourth offset voltage u3 or u4 of the first or the second mean-value former 17 or 18 respectively. The ipput of the first mean-value former 17, as described just before, is grounded together with the root-mean-square-value module 16, while the second mean-value former 18 is connected to the output of the variable-gain amplifier 14 as adjusted to zero. The measured first or second mean-value signal um1 or um2 is the third or fourth offset voltage u3 or u4 to be stored, respectively. These mean-value formers 17, 18 may, for example, contain active RC filter circuits.

The sixth correcting value to be determined by way of adjustment, and to be stored, is the gain factor v of the root-mean-square-value module 16, with this gain factor lying in the proximity of one (unity), and being determined from the root-mean-square-value signal ue when a defined reference voltage is applied to the input of the root-mean-square-value module 16 via both the first changeover switch s1 and the second electronic multiple changeover switch 28.

Besides the correcting values, also the following circuit-specific constants of the manufacturer are already capable of being stored in the storage section of the microprocessor 26:

The first constant is the slope c1 of the Hall-effect measuring circuit 5 which indicates how, in the case of a preset (fixed) Hall current ih, the Hall voltage uh changes in dependence upon the current I to be measured;

The second circuit-specific constant is the Hall-current slope c2 which indicates to what extent the Hall current ih depends on the input voltage of the constant current source 6, i.e. on the divided voltage ut;

The third circuit-specific constant is the division factor k as determined by the division ratio between the divided voltage ut and the supplied voltage U, which depends on the respective measuring range;

The fourth constant is the value of the Hall current ih as preset within one current-measuring range.

To the measured values as displayed there now apply the following rules for proportioning:

To the current I to be measured, with the Hall voltage uh being applied as an input signal to the root-mean-square-value module 16:

$$I = ((ue-u2)v^{-1} - pih - u1)(c1)^{-1}(ih)^{-1};$$

To the voltage U to be measured, with the input signal of the root-mean-square-value module 16 being the divided voltage ut, and the output signal being the root-mean-square-value signal ue':

$$U = (ue' - u2)(kv)^{-1};$$

To the apparent power Ps to be measured:

$$Ps = (ue' - u2)((ue - u2)v^{-1} - pih - u1)(-kvih)^{-1}(c1)^{-1},$$

with the voltage-relevant root-mean-square-value signal ue' and the current-relevant root-mean-square-value signal ue being determined one after the other in terms of time;

To the real power Pw to be measured, with the first mean-value former 17, at its input, being supplied with the divided voltage ut, and with the second mean-value former 18, at its input, being supplied with the Hall voltage uh:

$$Pw = (um2 - (pc2)(um1 - u3) - u1 - u4)(kc1)^{-1}(c2)^{-1};$$

To the frequency f to be measured:

$$f = 1/T;$$

and

To the power factor cos (phi) to be measured:

$$\cos(phi) = \cos(2(pi)\int f dt).$$

Relative thereto, pi is the known ratio of circumference to diameter of the unit circle. The given rules for proportioning, relating to the values to be displayed, become more simple when individual correcting values are brought to their rated values by employing an adjusting method as is accomplished, for example, by means of the zero-adjustment circuit 15 in the case of the first offset voltage u1.

The ascertainment of the various displayed measuring quantities from the given rules for proportioning has proved extremely advantageous, because with the aid of one single measuring instrument essential measuring quantities from the fields of electrical installation engineering can be exactly detected. By the electronic preliminary adjustment which can also be currently repeated during operation by a special actuation of the measuring key mt, there is rendered superfluous a manual adjustment which has been noticed to be a nuisance to the user, and which, at the most, was restricted to a particularly critical correcting quantity. Thus, also the usual interfering quantities are without any influence, such as the temperature, the drift of individual components, or the ageing thereof. But also such interfering quantities which are likely to result from the residual magnetism in the clip 12 of the clip-on measuring device, and which might have originated in the course of measuring a large current I and which, without any compensation, would have a disturbing effect upon the following measurements, can be eliminated in this way.

Another advantage is seen in providing the clip 12 with two Hall sensors 7,8, with the Hall-sensor voltages thereof being connected to the summer 13. Owing to this arrangement, also in connection with the setting of the Hall-current ratio, the displayed measured value is almost independent of the position of the embraced current conductor.

A very practical advantage of the digital signal processing is that measurements can also be carried out at inaccessible points, because the displayed values are stored in the microprocessor 26. Also, it is of advantage that, by means of the liquid-crystal display 27, it is indicated whether the measured value is a d.c. or a.c. quantity, and what polarity and energy-flux direction the d.c. quantities have.

With a measuring device realized in accordance with the invention, the following measuring functions, which can be set by a rotary switch, can be performed:

(a) current measurements with automatic range switching 200 A/1000 A (b) peak-value measurements in the 200-A range (c) peak-value measurements in the 1000-A range (d) voltage measurement with automatic range switching 200 V/750 V (e) real-power measurement with automatic range switching 20 kW/200 kW (f) apparent-power measurement with automatic range switching 20 kVA/200 kVA (g) frequency measurement with automatic range switching 200 Hz/1000 Hz (h) cos (phi) measurement.

The electronic components required for this purpose are mounted, for example, on three circuit boards. The major part of the circuitry serves the analog reconditioning and further processing of the measured quantities; the mask-programmed microprocessor 26 recognizes the desired measurement, controls the sequence of operations and drives the liquid-crystal display.

We claim:

1. A multimeter having a clip (12) including at least one Hall sensor (7;8); a Hall-effect measuring circuit (5) for measuring a current I flowing in a conductor embraced by said clip; and a display unit (27) for displaying the value of the current I as measured by said measuring circuit; and wherein said multimeter has at least two switchable measuring ranges, said multimeter characterized by the following features:

(a) voltage-measuring circuit (2) for measuring a voltage U which, as a d.c. or a.c. quantity, is supplied to an input means (3, 4): and (b) a microprocessor and storage means for storing data (26), wherein the measured current I and voltage U values, together with stored correcting values resulting from an adjusting measurement preceding the actual measurement in terms of time, and with circuit-specific constants as stored by the manufacturer, are stored as data and are selectively processed by means of said microprocessor (26) into values of direct or of alternating current I, of d.c. or a.c. voltage U, of apparent power Ps, of real power Pw, of power factor cos (phi), or of the frequency f, with the microprocessor controlling the display unit to display the aforesaid values, by forming the root-mean-square value, being independent of the waveform of the current I to be measured and/or of the voltage U to be measured, and wherein range switching is effected by said microprocessor (26) as soon as it is detected by the latter that a range has been exceeded in the course of a measuring process.

2. A multimeter as claimed in claim 1, characterized by the following features:

for the signal-processing purpose there is moreover provided a function transformer (30) which comprises at least one root-mean-square-value module or former (16) for providing a root-means-square-value signal ue, at least one first and one second mean-value former (17, 18) for providing a first or a second mean-value signal um1, um2, as well as one first electronic multiple switch (29) which passes the measuring signals as processed in said function transformer (30) to a digitizing unit (19), the control of said Hall current ih as supplied to respectively one of said Hal sensors (7, 8) is effected by a controllable constant current source (6) whose control voltage is constant during the current measurement and the apparent-power measurement ($P_s$), and is derived from a preset reference voltage (ur), and during the real-power measurement (Pw), the control voltage for said constant current source (6) and, consequently, said Hall current ih are proportional to the instantaneous value of the supplied voltage U.

3. A multimeter as claimed in claim 2, characterized by the following features:

a first correcting value of the Hall voltage uh to be determined by way of adjustment, is the first offset voltage u1 which appears when ih=0 and I=0, a second correcting value of said Hall voltage uh to be determined by way of adjustment is the proportional control factor p appearing in the case of a zero variation which is proportional to said Hall current ih, and is acertained from measurements of said Hall voltage uh when I=0, as well as in the case of different Hall currents ih1, ih2, a third correcting value to be determined by way of adjustment is the second offset voltage u2 of said root-mean-square-value module (16), a fourth of fifth correcting value to be determined by way of adjustment is the third or fourth offset voltage u3 or u4 of the first or second mean-value former (17, 18), respectively, a sixth correcting value likewise to be determined by way of adjustment is the gain factor v of said root-mean-square-value module (16), a first circuit-specific and stored constant is the slope c1 of said Hall-effect measuring circuit (5), a second circuit-specific and stored constant is the Hall-current slope c2 which is determined by the ratio of said Hall current ih as dependent on the supplied voltage U, to the voltage ut as divided by means of the voltage divider (t), a third circuit-specific and stored constant is the division factor k which is determined by the division ratio of said divided voltage ut to said supplied voltage U, which depends on the respective measuring range, and a fourth circuit-specific and stored constant is the value of the Hall current ih as preset within one current-measuring range.

4. A multimeter as claimed in claim 3, characterized in that to the displayed values there apply the following rules for proportioning:

to the current I to be measured, with the Hall voltage ih being applied as an input signal to said root-mean-square-value module (16):

$$I=((ue-u2)v^{-1}-pih-u1)(c1)^{-1}(ih)^{-1},$$

to the voltage U to be measured, with the input signal of said root-mean-square-value module (16) being the divided voltage ut, and with the output signal being the root-mean-square-value signal ue':

$$U=(ue'-u2)(kv)^{-1},$$

to the apparent power Ps to be measured:

$$Ps=(ue'-u2)((ue-u2)v^{-1}-pih-u1)(-kvih)^{-1}(c1)^{-1},$$

to the real power Pw to be measured, with the first mean-value former (17), at its input, being supplied with the divided voltage ut, and with the second mean-value former (18), likewise at its input, being supplied with the Hall voltage uh:

$$Pw=(um2-(pc2)(um1-u3)-u1--u4)(kc1)^{-1}(c2)^{-1},$$

to the frequency f to be measured:

$$f=1/T,$$

with the period T thereof being measured in such a way on the basis of the time interval between two unidirectional zero crossings of either said divided voltage ut or said Hall voltage uh, with the aid of a first comparator (21) serving as a zero-crossing detector, that the output signal of said comparator (21) is applied to a logical circuit (23) providing a first gating signal which, during the aforementioned period, passes the counting signals of a clock generator (24) to said microprocessor (26), and to the power factor cos (phi) to be measured:

$$\cos(phi)=\cos(2(pi)fdt),$$

with dt indicating the time interval between the unidirectional zero crossings of both said Hall voltage uh and said divided voltage ut, and with said divided voltage ut being fed to said first comparator (21) and said Hall voltage uh being fed to a second comparator (22), with the output signals thereof, for the purpose of determining said time interval dt, being applied to said logical circuit (23) for causing the latter to generate a second gating signal.

5. A multimeter as claimed in claim 4, characterized in that during the adjusting measurement, at least one of said correcting values to be determined is adjusted to its rated value by means of an associated adjusting circuit, so that owing to the adjusted correcting values, particularly owing to at least one offset voltage u1, u2, u3, u4 adjusted to zero, there is effected a simplification of said rules for proportioning.

6. A multimeter as claimed in claim 5, characterized in that said first offset voltage u1 is adjusted to zero by a zero-adjusting circuit (15) which is controlled by said microprocessor (26).

7. A multimeter as claimed in claim 1, characterized by the following features:
said Hall-effect measuring circuit (5) comprises two Hall sensors (7, 8) whose Hall-current ratio is variable, and
the Hall-sensor voltages hs associated with said two Hall sensors (7, 8) are fed to a summer (13) whose output signal is amplified by means of a variable-gain amplifier (14).

8. A multimeter as claimed in claim 1, characterized in that during said current measurement, the output signal of said Hall-effect measuring circuit (5) is optionally applied to one of the two input/output combination sockets (3, 4), via a buffer amplifier (31), either directly as an instantaneous-value signal, or else via said root-mean-square-value module (16) as a root-mean-square-value signal.

9. A method for measuring electrical signals by means of an electrically operated measuring device, comprising an analog circuit module, a digital circuit module including a digital processor, and a digital memory, said method comprising the steps of:
generating offset signals when said measuring device is switched on, said offset signals being generated within said measuring device within said analog circuit module;
storing said offset signals in digital form in said memory;
converting said digital offset signals stored in said memory into analog offset electric signals during a subsequent measurement of said electrical signal by said measuring device; and
subtracting said offset electrical signals from said electrical signals to be measured under control of a digital processor, so that said measured electrical signals subject to offset subtraction are valid measurements of the electrical signal sought to be measured.

10. The method of claim 9 wherein said variable current source is switched among a plurality of predetermined values, each one of said predetermined values corresponding to a range of currents to be measured, whereby automatic range selection is effected.

11. The method of claim 10 wherein said step of generating said Hall current, said variable current source generates said Hall current in response to an operating voltage to be measured, said Hall current being generated changing in accordance with said operating voltage for real power measurement.

12. The method of claim 11 further comprising the steps of:
applying said operating voltage to said variable current source via an analog multiplexer and voltage divider, said analog multiplexer having its outputs coupled to the inputs of said voltage divider; and
controlling said multiplexer by said digital processor of said measuring device so that said variable current source generates a Hall current corresponding to the lowest possible measuring range of said operating voltage,
whereby said measuring device measures the magnitude of the voltage.

13. The method of claim 9 wherein said measuring device includes a plurality of legs, a Hall sensor being provided in each leg, the method further comprising the steps of:
generating Hall voltages from each one of said plurality of Hall sensors;
summing said Hall voltages in a summing circuit;
amplifying said summed Hall voltages in a variable gain amplifier, said gain of said amplifier being changed to accommodate for range adjustment of said electrical signal to be measured;
generating a root mean square value corresponding to said amplified signal in a root mean square module; and
switching said amplified signal from said root means square value module, wherein said root mean square value is generated, to means for measuring the voltage magnitude of said operating voltage.

14. The method of claim 13 further comprising the step of:
generating an analog signal in a D-to-A converter;
controlling said variable gain amplifier in response to the analog output of said D-to-A converter; and
generating a digital input to said D-to-A converter from said digital processor in accordance with said stored offset signals within said digital memory so that the output of said variable gain amplifier is substantially zeroed.

15. The method of claim 13 further comprising the steps of:
generating a DC voltage within said root mean square value module corresponding to the root means square value of said amplified electrical signal provided by said variable gain amplifier;
digitizing said DC voltage corresponding to said root mean square value;
storing said digitizing DC voltage in said memory under control of said digital processor;
reading said stored digital value of said DC voltage from said memory under control of said processor; and
displaying a digital numeric value of said digitized DC voltage on a display.

16. The method of claim 13 further comprising the steps of:
integrating said amplified Hall voltage from said variable gain amplifier in an integrator coupled in parallel with said variable gain amplifier with said root mean square value module;
generating the DC voltage component of said amplified Hall voltage from said integrator;

digitizing said DC voltage component of said amplified Hall voltage;

storing said digitized value of said DC voltage component of said Hall voltage into a memory subject to control of said digital processor;

reading said stored digital value of said DC component of said amplified Hall voltage from said memory;

comparing said read digital value of said DC component to said stored digital value corresponding to said root mean square value generated by said root mean square value module;

generating an AC current symbol if the absolute value of said DC voltage component of said Hall voltage is less than one half of said root mean square value;

generating a negative or positive symbol if the absolute value of said DC voltage component of said Hall voltage is greater than or equal to one half of said root mean square value depending upon the polarity of said DC voltage component of said Hall voltage respectively; and displaying said generated AC current symbol, negative symbol or positive symbol.

17. The method of claim 13 further comprising the steps of:

selectively switching the instantaneous value of said electrical signal and root mean square value of said electrical signal to an analog value output socket via a changeover switch.

18. The method of claim 13 further comprising the steps of:

selectively providing a divided voltage to an integrator via a changeover switch;

generating a DC voltage output value from said integrator;

digitizing said DC voltage output value by coupling said DC output voltage from said integrator via an analog multiplexer into an analog-to-digital converter;

storing said digitized DC voltage output value as an offset value into said memory setting off said offset value in said memory within said digital processor against a subsequently measured real power value in order to correct the offset voltages which exist at said Hall sensor during measurement of said real power value.

19. The method of claim 13 further comprising the steps of:

making a current measurement under control of said digital processor;

making a voltage measurement under control of said digital processor, wherein a digitized value of said root mean square of said current and voltage are each stored within said memory;

computing apparent power within said digital processor by multiplication of said root mean square values of said voltage measurement and current measurement; and displaying computed apparent power.

20. The method of claim 9 further comprising the steps of:

detecting two adjacent zero crossings of measured voltage;

generating a clock signal for that period of time between said two detected zero crossing of said voltage;

counting said number of clock signals during said period between said two zero crossings within said digital processor; and displaying said counted number of clock signals as measured frequency of said electrical signal.

21. The method of claim 9 further comprising the steps of:

making a current measurement;

making a voltage measurement, said current and voltage measurements made pursuant to control of said digital processor;

converting said current and voltage measurements into square wave signals;

detecting two adjacent edges of the same plurality of said square wave signals corresponding to said current and voltage signals;

generating a clock signal during said time period between said two adjacent edges of the same plurality of said square wave signals;

counting said clock signal with said digital processor during said period;

detecting adjacent zero crossings of said voltage signal;

generating a clock signal during that time period between said detected adjacent zero crossings of said voltage signal;

counting the number of clock signal generated during said time period between said zero crossings of said voltage signal within said digital processor;

calculating the cosine of the phase difference between said current and said voltage signals based upon the number of pulses counted between said edges of said square wave signals and said zero crossings; and displaying said calculated cosine of said phase difference between said current and voltage signals.

22. A circuit for measuring electrical signals comprising:

a digital processor with a memory;

a root mean square circuit for generating the root mean square of a signal input to it;

an adjustable current source for supplying a Hall current of selective amplitude, said adjustable current source having two inputs;

a plurality of Hall sensors having Hall current terminals coupled to said adjustable current source and supplied with said Hall current thereby, and having Hall voltage terminals;

a summing circuit coupled to said Hall voltage terminals of said plurality of Hall sensors, said summing circuit for summing all voltages generated by said Hall sensors;

a variable gain amplifier having its input coupled to the output of said summing circuit;

an electronically controlled first and second changeover switch, each said changeover switch having two changeover contacts and a switching contact which is selectively coupled to one of said changeover contacts, said first and second changeover switches being coupled to and controlled by said digital processor, a first changeover contact of said first changeover switch coupled to the output of said variable gain amplifier, a second changeover contact of said first changeover switch coupled to the output of said variable gain amplifier, a second changeover contact of said first changeover switch being coupled to a preselected voltage, said switching contact of said first changeover switch being coupled to said root mean square value circuit, said root mean square circuit generating a DC voltage corresponding to the root mean square value of the output of said variable gain amplifier, said second changeover contact of said first changeover switch also being coupled to a first changeover contact of said second changeover switch, said second changeover switch having its switching contact connected to the first one of the inputs of said adjustable current source, a second changeover contact of said second changeover switch being connected to the Hall current terminals of said Hall sensors, said Hall current terminals being coupled to said output of said adjustable current source and a second input of said adjustable current source; and an analog-to-digital converter having its input coupled to said DC voltage of said root mean square value circuit and its output coupled to said memory input of said digital processor.

23. The circuit of claim 22 further comprising a digital-to-analog converter, said digital processor being coupled to the input of said digital-to-analog converter, the output of said digital-to-analog converter being connected to one input of said variable gain amplifier.

24. The circuit of claim 22 further comprising:
a first integrator, said output of said variable gain amplifier being coupled to said input of said first integrator; and
a multiplexer, said output of said first integrator being coupled to an input of said multiplexer and said output of said variable gain amplifier being coupled to a corresponding second input of said multiplexer, the output of said multiplexer being coupled to the input of said analog-to-digital converter.

25. The circuit of claim 22 further comprising:
a second integrator, said output of said variable gain amplifier being coupled to said input of said second integrator, the output of said second integrator being coupled to a corresponding third input of said second multiplexer.

26. A multimeter circuit for measuring a plurality of electrical parameters of a signal in a wire with automatic offset error adjustment, automatic zeroing adjustment and automatic range selection comprising:
a digital processor;
a magnetic circuit loop with two gaps through which loop said wire is disposed;
two Hall effect sensors, one sensor disposed in each one of said gaps in said magnetic circuit loop;
a summing circuit coupled to said Hall effect sensors for summing the output Hall voltages from said sensors;
a controlled voltage source coupled to said digital processor, said controlled voltage source generating a zeroing voltage in response to command signals from said digital processor;
a variable amplifier coupled to the output of said summing circuit to selectively generate an amplified measured analog signal corresponding to said electrical parameter to be measured or an intermediate function from which said electrical parameter to be measured is later computed, said variable amplifier coupled to and responsive to said controlled voltage source to generate a zero output before measurement of said parameters in said wire is performed, said zeroing voltage being applied to said variable amplifier to selectively cause said variable amplifier to generate said zero output;
a plurality of analog circuits for selectively generating a plurality of analog functions of signals input to said analog circuits, said analog functions including root mean squares and selected time integrals,
an analog-to-digital convertor means having an input selectively coupled to said plurality of analog circuits, said analog-to-digital convertor means for generating a digital signal corresponding to selected ones of said plurality of analog circuits, said analog-to-digital convertor means having its output coupled to said digital processor; and
a variable current source means having its output coupled to said Hall sensors and controlled by said digital processor for selectively generating offset currents to cancel offset errors in said Hall sensors and for generating selected magnitudes of Hall currents dependent on the amplitude ranges of said electrical parameters to be measured,
whereby said multimeter circuit measures current in said wire with automatic range switching, measures peak value currents in said wire with automatic range switching, measures voltage in said wire with automatic range switching, measures real power in said wire with automatic range switching, measures apparent power in said wire with automatic range switching, measures frequency of said signal in said wire with automatic range switching, and measures a function of phase of said signal in said wire.

* * * * *